(12) United States Patent
Imai et al.

(10) Patent No.: US 9,360,167 B2
(45) Date of Patent: Jun. 7, 2016

(54) LED MODULE AND LED LAMP EMPLOYING SAME

(71) Applicants: CITIZEN HOLDINGS CO., LTD., Tokyo (JP); CITIZEN ELECTRONICS CO., LTD., Yamanashi (JP)

(72) Inventors: Sadato Imai, Yamanashi (JP); Hirohiko Ishii, Yamanashi (JP)

(73) Assignees: CITIZEN HOLDINGS CO., LTD., Tokyo (JP); CITIZEN ELECTRONICS CO., LTD., Yamanashi (JP)

( * ) Notice: Subject to any disclaimer, the term of this patent is extended or adjusted under 35 U.S.C. 154(b) by 111 days.

(21) Appl. No.: 14/345,263

(22) PCT Filed: Sep. 18, 2012

(86) PCT No.: PCT/JP2012/073845
§ 371 (c)(1),
(2) Date: Mar. 17, 2014

(87) PCT Pub. No.: WO2013/042662
PCT Pub. Date: Mar. 28, 2013

(65) Prior Publication Data
US 2014/0362573 A1    Dec. 11, 2014

(30) Foreign Application Priority Data

Sep. 20, 2011 (JP) ................... 2011-204307
Sep. 26, 2011 (JP) ................... 2011-208896
Sep. 26, 2011 (JP) ................... 2011-208897

(51) Int. Cl.
*F21K 99/00*    (2010.01)
*F21V 29/00*    (2015.01)
(Continued)

(52) U.S. Cl.
CPC ............. *F21K 9/1355* (2013.01); *F21K 9/50* (2013.01); *F21V 29/006* (2013.01); *F21V 29/51* (2015.01);
(Continued)

(58) Field of Classification Search
CPC ......... F21K 9/50; F21K 9/135; F21K 9/1355; F21V 3/00; F21V 29/51; F21V 29/006; F21Y 2101/02; F21Y 2111/001; H05K 3/32; H05K 2201/10106; H05K 2201/10295; H05K 2201/10962; H01L 25/0753; H01L 33/58; H01L 33/60; H01L 33/64; H01L 2224/16225; H01L 2924/15311
See application file for complete search history.

(56) References Cited

U.S. PATENT DOCUMENTS 7,420,268 B2 * 9/2008 Chen ..................... F21K 9/00
257/686
2003/0031015 A1    2/2003 Ishibashi
(Continued)

FOREIGN PATENT DOCUMENTS

JP    2000-045237 A    2/2000
JP    2003-059305 A    2/2003
(Continued)

OTHER PUBLICATIONS

European Patent Office, Extended European search report for EP Application No. 12833941.3, Apr. 2, 2015.
(Continued)

*Primary Examiner* — Stephen F Husar

(57) ABSTRACT

Provided is an LED module with which wide light distribution may be obtained even with a small number of attached LED devices, and which has a simple structure which may be easily assembled. An LED module includes a column-shaped mounting substrate and a plurality of LED devices. The mounting substrate has a structure further including an insulation layer between a first copper plate and a second copper plate. When mounting the plurality of LED devices on a leading end part of the mounting substrate, the first copper plate is used as the plus-side electrode, and the second copper plate is used as the minus-side electrode.

13 Claims, 7 Drawing Sheets

(51) Int. Cl.
*H01L 33/60* (2010.01)
*H01L 33/64* (2010.01)
*H01L 25/075* (2006.01)
*H05K 3/32* (2006.01)
*F21V 29/51* (2015.01)
*H01L 33/58* (2010.01)
*F21V 3/00* (2015.01)
*F21Y 101/02* (2006.01)
*F21Y 111/00* (2016.01)

(52) U.S. Cl.
CPC ............ *H01L 25/0753* (2013.01); *H01L 33/60* (2013.01); *H01L 33/64* (2013.01); *H05K 3/32* (2013.01); *F21K 9/135* (2013.01); *F21V 3/00* (2013.01); *F21Y 2101/02* (2013.01); *F21Y 2111/001* (2013.01); *H01L 33/58* (2013.01); *H01L 2224/16225* (2013.01); *H01L 2924/15311* (2013.01); *H05K 2201/10106* (2013.01); *H05K 2201/10295* (2013.01); *H05K 2201/10962* (2013.01)

(56) References Cited

U.S. PATENT DOCUMENTS

| | | |
|---|---|---|
| 2006/0001384 A1 | 1/2006 | Tain et al. |
| 2006/0214179 A1 | 9/2006 | Cao |
| 2007/0045802 A1 | 3/2007 | Chen |
| 2010/0207502 A1 | 8/2010 | Cao et al. |
| 2013/0106301 A1* | 5/2013 | Imai ........................ F21K 9/135 315/200 R |

FOREIGN PATENT DOCUMENTS

| | | |
|---|---|---|
| JP | 2003-304000 A | 10/2003 |
| JP | 2005-026303 A | 1/2005 |
| JP | 2007-214246 A | 8/2007 |
| JP | 2008-098544 A | 4/2008 |
| JP | 2008-527666 A | 7/2008 |
| JP | 2009-277586 A | 11/2009 |
| JP | 4735794 B2 | 7/2011 |
| WO | 2006/070457 A1 | 7/2006 |
| WO | 2006-075290 A1 | 7/2006 |
| WO | 2011/087023 A1 | 7/2011 |

OTHER PUBLICATIONS

State Intellectual Property Office of the People's Republic of China, Office Action for Chinese Patent Application CN201280045639.0, Nov. 2, 2014.
International Search Report for PCT/JP2012/073845, Oct. 10, 2012.
European Patent Office, Office Action for EP Application No. 12833941.3, Jan. 19, 2016.

* cited by examiner

LED MODULE AND LED LAMP EMPLOYING SAME

TECHNICAL FIELD

The present invention relates to an LED module including a column-shaped mounting substrate and an LED device, and to an LED lamp including a light source in the vicinity of the center of a globe using the LED module.

BACKGROUND ART

A lighting device using an LED element as a light source begins to spread. In some bulb-shaped LED lamps of the LED lighting devices, an optical member, such as a reflector and a prism, is arranged within the globe in order to widen the light distribution (e.g., Patent Document 1). Further, in some bulb-shaped LED lamps, the number of elements that block light from a light emitting part is reduced by arranging the light emitting part in the vicinity of the center of the globe (e.g., Patent Documents 2 and 3). Furthermore, in some bulb-shaped LED lamps, a large number of LED devices are arranged three-dimensionally within the globe (e.g., Patent Documents 4 and 5). In the following explanation, an LED element cut from a wafer is referred to as an LED die, an LED element in which the LED die is coated with a fluorescent resin and electrodes for mounting are formed is referred to as an LED device, and a constituent part in which the LED device is mounted on a mounting substrate is referred to as an LED module.

FIG. 1 of Patent Document 1 illustrates a beacon light A (LED lamp) including a plurality of LED lamps 2 (LED devices) and a substantially funnel-shaped light control member 3 inside a globe 5. The outer surface 31 of the light control member 3 is a reflector, which bends light from the LED lamps 2 arranged on the periphery of a base material 1 substantially by right angles. The center part of the light control member 3 is hollow and allows light from the LED lamp 2 arranged at the center part of the base material 1 to pass straight as it is. As described above, the beacon light A radiates light within a desired range of angle.

Recently, the size of an LED die has increased and the current tolerance has also become large. Because of this, an LED lamp which is bright and has wide light distribution may be obtained by arranging a single or a few LED dies in the center of the globe. For example, FIG. 1 of Patent Document 2 illustrates a super-wide light distribution type LED lamp in which part of a metal frame 1 is provided with a raised part 1A and on the raised part 1A, an LED chip 3 (LED die) is mounted. In the super-wide light distribution type LED lamp, the LED chip 3 is arranged in the vicinity of the center of a translucent plastic cover 6 and the wide light distribution characteristic is obtained.

FIG. 2 of Patent Document 3 illustrates a light emitting module 64 (LED lamp) including three light emitting element chips 20 (LED die) at the center part of a translucent core body 65 (globe). The light emitting element chips 20 are connected to lead parts 31 and lead parts 33 by silver paste. The lead parts 31 and the lead parts 33 are fixed to a terminal mold part 161. The surroundings of the light emitting element chips 20, the lead parts 31, and the lead parts 33 are enveloped with a liquid mold medium 30. The liquid mold medium 30 diffuses heat produced by the light emitting element chips 20 into the surroundings by convection by being in direct contact with the light emitting element chips 20. The liquid mold medium 30 is accommodated and sealed within the translucent core body 65 together with the light emitting element chips 20.

As another technique for obtaining an LED lamp which is bright and has wide light distribution, there is a technique in which a large number of LEDs are arranged three-dimensionally within a globe. For example, FIG. 1 of Patent Document 4 illustrates an LED bulb (LED lamp) including a large number of LED chips 6 (LED device) on a FPC (flexible printed circuit) uniformly arranged in the shape of a basket within a cover 2 (globe). This LED bulb includes a globular light source and radiates direct light of the LED chips 6 in a variety of directions, which makes it possible to radiate light in all directions.

FIG. 1 of Patent Document 5 illustrates a bulb-shaped LED luminaire 1 in which a large number of chip LEDs 10 (LED device) are arranged on the top surface and side surfaces of a substrate structure 5 having a multi-surface structure within a transparent cover 4 (globe). In the bulb-shaped LED luminaire 1, an electrically conductive material is applied to side substrates 6 and a ceiling plate 7 included in the substrate structure 5, and materials excellent in thermal conductivity are used as the plate materials, and thereby heat dissipation efficiency is improved.

PRIOR ART DOCUMENT

Patent Document

Patent Document 1: Japanese Unexamined Patent Publication No. 2000-45237 (FIG. 1)
Patent Document 2: Japanese Unexamined Patent Publication No. 2008-98544 (FIG. 1)
Patent Document 3: Japanese Patent Publication No. 4735794 (FIG. 2)
Patent Document 4: Japanese Unexamined Patent Publication No. 2003-59305 (FIG. 1)
Patent Document 5: Japanese Unexamined Patent Publication No. 2009-277586 (FIG. 1)

SUMMARY OF THE INVENTION

As in the LED lamp illustrated in FIG. 1 of Patent Document 1, in an LED lamp in which optical members are arranged within a globe, the number of parts increases by the number of optical members, the structure becomes complicated and further, the number of assembling processes increases. Therefore, this LED lamp is not favorable.

In the LED lamps illustrated in FIG. 1 of Patent Document 2 and in FIG. 2 of Patent Document 3, since only a few LED dies are arranged in the vicinity of the center of the globe as a light emitting part, the structure should become simple and the manufacturing burden should be reduced. However, in the LED lamp illustrated in Patent Document 2, the LED die is arranged in the vicinity of the center of the globe by deforming the lead frame, and thus the structure thereof is for a super-compact LED lamp. Because of this, if the size is increased in this state, the pressing machine and the injection molding apparatus are also increased in size and it is no longer possible to easily manufacture the LED lamp. In the light emitting module 64 (LED lamp) illustrated in Patent Document 3, the light emitting element chips 20 (LED die) are mounted on the lead parts 31 and the lead parts 33 fixed to the terminal mold part 161. That is, although the light source is located in the vicinity of the center of the globe, the LED dies are mounted on a large, complicated and oddly-shaped part, and therefore, the structure becomes complicated and the burden of manufacture is also increased. Further, as in the light emitting module 64 in Patent Document 3, in a system in which heat of the light emitting element chips 20 is dissipated by the liquid mold medium 30, the weight is increased and the structure becomes more complicated.

Even if bright and wide light distribution is obtained by an LED lamp in which a large number of LEDs are arranged three-dimensionally within a globe as in the LED bulbs (LED lamp) illustrated in FIG. 1 of Patent Document 4 and in FIG. 1 of Patent Document 5, a large number of LED devices are necessary and further, the structure of the mounting part becomes complicated and the number of manufacturing processes increases. The LED lamp in Patent Document 4 adopts a process in which the LED devices are mounted on the planar FPC and then the FPC is turned into a three-dimensional one, thereby improving the manufacturing process to a certain degree. However, since a large number of LED devices are necessary and the planar FPC is bent into a three-dimensional one, the structure is complicated and the burden of manufacture is heavy. Patent Document 5 discloses an assembling method of the substrate structure 5 (mounting substrate). In this method, firstly the LED devices are mounted on a substrate 11 and the side substrates 6 are cut out, and then the side substrates 6 are coupled again and further, the ceiling plate 7 is attached. However, even by this method, the process is complicated and long. Patent Document 5 describes that thermal conductivity can be improved by selecting the materials of the side substrates 6 and the ceiling plate 7 from those having excellent thermal conductivity, however, the thermal connection relationship between a thermally conductive case 3 that dissipates heat to outside and the substrate structure 5 is not clear.

Consequently, in order to obtain an LED lamp having wide light distribution by a comparatively simple method, it is only necessary to arrange the LED device in the vicinity of the center of the globe and to support the LED device by a column-shaped mounting substrate. That is, it is only necessary to prepare an LED module including an LED device and a column-shaped mounting substrate.

An object of the present invention is to provide an LED module capable of obtaining a wide light distribution even with a small number of LED devices, and having a simple structure which may be easily assembled. Another object of the present invention is to provide an LED lamp having a simple structure which may be easily assembled even if a light source is provided in the vicinity of the center of the globe, and having excellent heat dissipation efficiency.

An LED module of the present invention includes a column-shaped mounting substrate in which a first metal plate, an insulation layer, and a second metal plate are laminated in order, the mounting substrate having a long side in the surface direction of the first metal plate and the second metal plate, the length of the long side being greater than the thickness in the lamination direction, and a plurality of LED devices connected to the first metal plate and to the second metal plate at a leading end part in the long side direction of the mounting substrate with the first metal plate as a plus-side electrode and the second metal plate as a minus-side electrode.

In the LED module of the present invention, the LED devices as a light source are mounted at the leading end part of the column-shaped mounting substrate. The mounting substrate has a structure in which the insulation layer is sandwiched between the two metal plates. The mounting substrate can be manufactured by a well-known method in which an insulating material is sandwiched by two large-sized metal plates and the large-sized metal plates are cut into a column shape. Since the LED devices are arranged at the leading end part of the mounting substrate, the number of members that block light near the LED devices is reduced, and therefore, wide light distribution can be obtained. Further, as the plus-side and minus-side electrodes, the two metal plates are utilized for electrical connection of the LED devices.

Preferably, in the LED module, the mounting substrate has two side surfaces to which the insulation layer is exposed, and part or all of the plurality of LED devices are mounted onto the two side surfaces.

Preferably, in the LED module, part of the plurality of LED devices are mounted onto an end surface of the leading end part in the long side direction of the mounting substrate.

Preferably, in the LED module, each of the plurality of LED devices includes a plurality of LED dies, and the plurality of LED dies is connected in series.

Preferably, in the LED module, each of the LED devices comprises any one of a reflective layer and a semi-transmissive reflective layer on the opposite surface of the surface mounted onto the mounting substrate.

Preferably, in the LED module, the first metal plate and the second metal plate are heat pipes.

An LED lamp of the present invention includes a globe, a case for supporting the globe, the above-described LED module in which the plurality of LED devices is arranged so as to be located in the vicinity of the center of the globe as a light source, and a thermally conductive part coupled to the case and with which the LED module comes into contact.

Preferably, in the LED lamp, a rear end part of the LED module on the opposite side of the leading end part in the long side direction of the mounting substrate of the LED module comes into contact with the thermally conductive part, and electricity is supplied to the LED module at a middle part of the LED module located between the leading end part and the rear end part.

Preferably, in the LED lamp, the thermally conductive part comprises an insertion hole, and the rear end part of the LED module is inserted into the insertion hole.

Preferably, the LED lamp further includes a circuit substrate arranged on the globe side of the case, the circuit substrate having a through hole which the LED module penetrates, and electricity is supplied from the circuit substrate to the LED module.

Preferably, in the LED lamp, a middle part of the LED module located between the leading end part and a rear end part on the opposite side of the leading end part in the long side direction of the mounting substrate of the LED module comes into contact with the thermally conductive part, and electricity is supplied to the LED module at the rear end part of the LED module.

Preferably, in the LED lamp, the thermally conductive part comprises an opening, and the LED module penetrates the opening.

The LED module of the present invention is capable of obtaining wide light distribution even with a small number of LED devices, and has a simple structure which may be easily assembled. The LED lamp of the present invention has a simple structure which may be easily assembled even if a light source is provided in the vicinity of the center of the globe, and has excellent heat dissipation efficiency.

BRIEF DESCRIPTION OF THE DRAWINGS

FIG. 7 is a sectional view of an LED device 12a.

MODE FOR CARRYING OUT THE INVENTION

Hereinafter, with reference to the drawings, an LED module and an LED lamp are explained. However, it should be noted that the technical scope of the present invention is not limited to embodiments thereof and includes the invention described in the claims and equivalents thereof. In the explanation of the drawings, the same symbols are attached to the same or corresponding elements, and duplicated explanation is omitted. The scale of members is appropriately changed for explanation.

Figure 1:
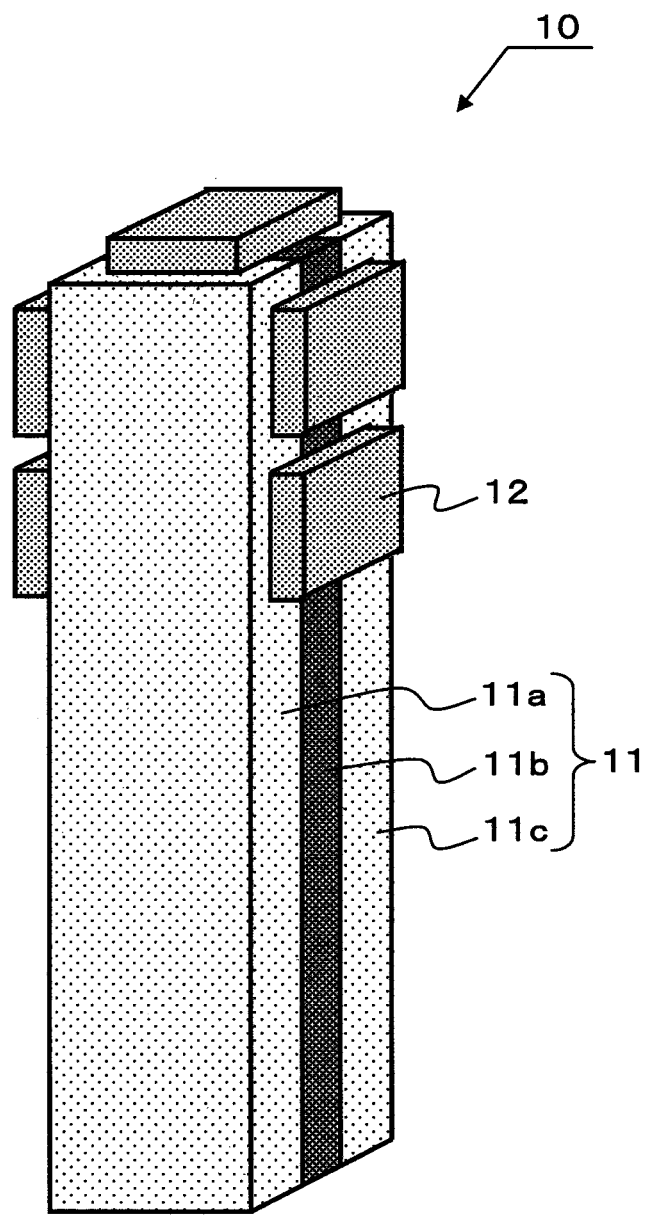
FIG. 1 is a perspective view of an LED module 10.

FIG. 1 is a perspective view of an LED module 10.

The LED module 10 includes a column-shaped mounting substrate 11 and five LED devices 12. In the mounting substrate 11, a copper plate 11a (first metal plate) and a copper plate 11c (second metal plate) are laminated with an insulation layer 11b sandwiched in between. The column-shaped mounting substrate refers to a substrate whose long side in the surface direction of the first metal plate and the second metal plate that are laminated has a length greater than the thickness in the lamination direction. Each LED device 12 is arranged at one leading end part in the lengthwise direction of the mounting substrate 11 so as to straddle the insulation layer 11b. The leading end part refers to the vicinity of one end surface in the lengthwise direction of the column-shaped mounting substrate including the end surface.

Figure 2:
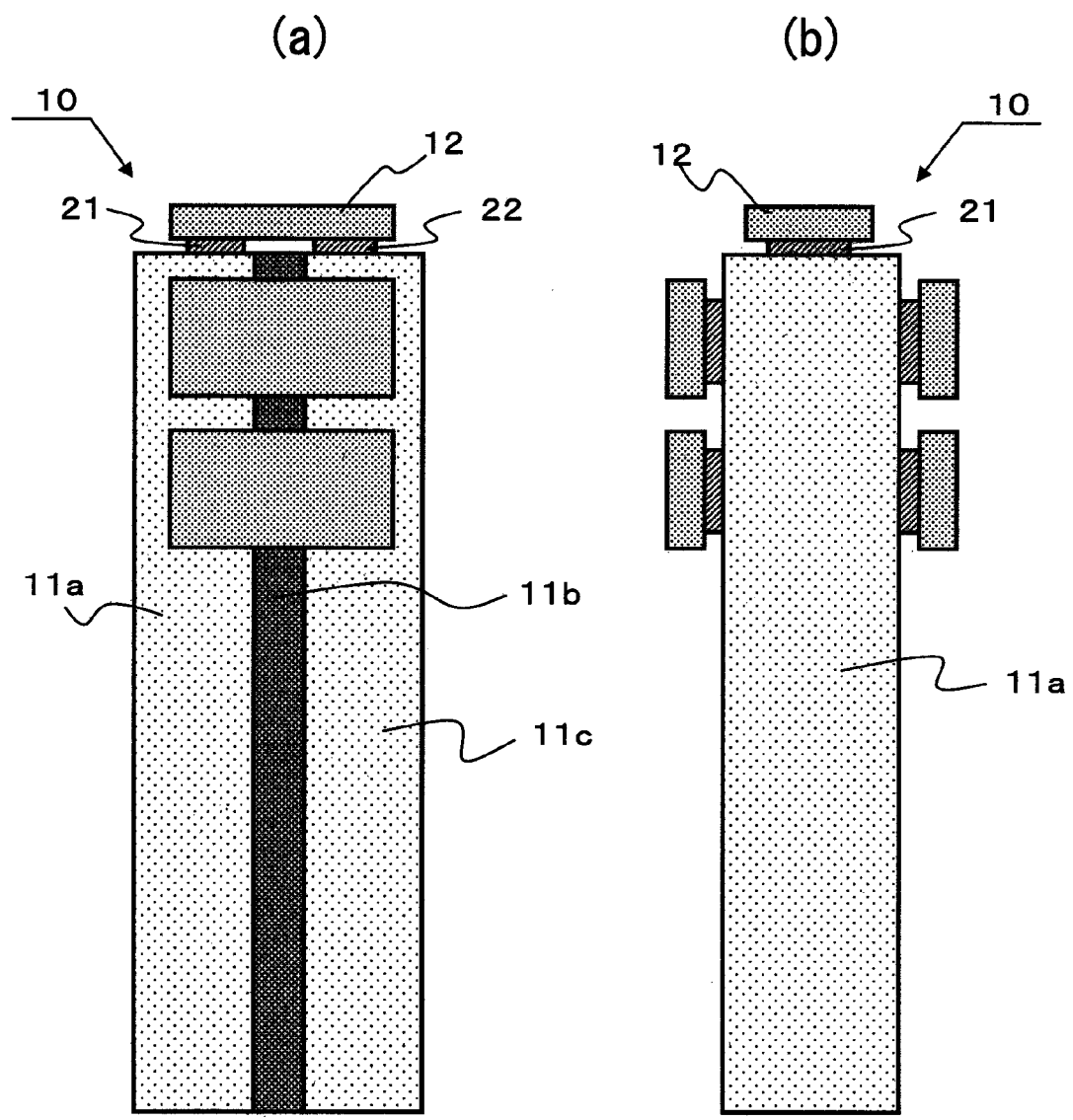
FIG. 2 is an outline view of the LED module 10.

FIG. 2 is an outline view of the LED module 10 of FIG. 1. FIG. 2a is a right side view of FIG. 1, and FIG. 2b is a left side view.

With FIG. 2, the mounting state of the LED devices 12 is explained in more detail. At the top part of the LED module 10, the LED device 12 is connected to the copper plate 11a and the copper plate 11c, respectively, by solder 21 and solder 22 as illustrated in FIG. 2a. The solder 21 electrically and mechanically connects a A-side protruding electrode 34a (see FIG. 3) of the LED device 12 to the copper plate 11a. Similarly, the solder 22 electrically and mechanically connects an n-side protruding electrode 34b (see FIG. 3) of the LED device 12 to the copper plate 11c. The copper plate 11a and the copper plate 11c support the LED device 12 as a rigid body and also function as a plus-side electrode and a minus-side electrode of the LED module 10, respectively. The copper plate 11a and the copper plate 11c dissipate heat of the LED device 12 as a metal excellent in thermal conductivity.

The thickness of the copper plate 11a and the copper plate 11c is 1.0 mm. The insulation layer 11b uses polyimide as a heat-resistant resin sheet and has a thickness of 0.12 mm. The planar size of the LED device 12 is 1.0 mm×0.6 mm. The dimension values of each part described above are merely an example and not limited to those. Since the copper plate 11a and the copper plate 11c rust, it is recommended to perform plating treatment on the surface or to form a protective film on part of the surface.

Figure 3:
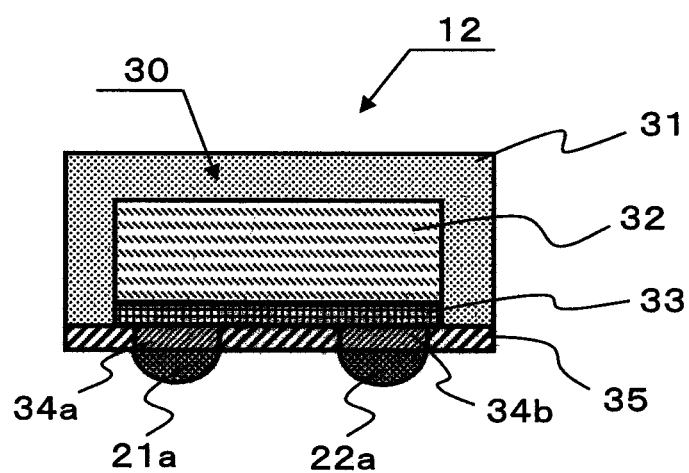
FIG. 3 is a sectional view of the LED device 12 included in the LED module 10.

FIG. 3 is a sectional view of the LED device 12.

An LED die 30 included in the LED device 12 includes a sapphire substrate 32, a semiconductor layer 33, the p-side protruding electrode 34a, and the n-side protruding electrode 34b. The sapphire substrate 32 is a transparent insulating substrate having a thickness of about 200 μm. In most of the LED packages (LED devices), the sapphire substrate is reduced in thickness to 80 to 120 μm in an attempt to reduce the thickness of the package and to improve the light emission characteristic. However, in the LED device 12, it is also necessary to secure a sufficient amount of emission of light emitted from the lateral side of the sapphire substrate 32, and therefore, the sapphire substrate 32 is made thicker than 80 to 120 μm. The semiconductor layer 33 is a GaN layer having a thickness of about 6 μm and includes a light emitting layer. The p-side protruding electrode 34a and the n-side protruding electrode 34b are connected to a p-type semiconductor layer and an n-type semiconductor layer included in the GaN layer, respectively, and form the anode and the cathode. The p-side protruding electrode 34a and the n-side protruding electrode 34b are each a bump whose core is gold or copper.

The side surface and the top surface of the LED die 30 are coated with a fluorescent resin 31. The fluorescent resin 31 is formed by including a phosphor, such as YAG, in the silicone resin and has a thickness of 100 to 200 μm. At the bottom of the LED die 30 and the fluorescent resin 31, there is a white reflective layer 35. The white reflective layer 35 is formed by kneading and mixing reflective fine particles, such as titanium oxide, in a binder composed of silicone or organo-polysiloxane, for example, and causing it to harden. The thickness of the white reflective layer 35 is about 30 to 50 μm. From the white reflective layer 35, the bottom surfaces of the p-side protruding electrode 34a and the n-side protruding electrode 34b are exposed. To the exposed parts of the p-side protruding electrode 34a and the n-side protruding electrode 34b, solder 21a and solder 22a are attached, respectively. The solder 21a and the solder 22a has a thickness of about 100 to 200 μm, and are illustrated in the state before reflow.

Next, with reference to FIG. 1 to FIG. 3, the light distribution of the LED module 10 is explained.

Light is emitted from the top surface (surface on the opposite side of the mounting surface) and the side surface of the LED device 12. The intensity of the emitted light has azimuth dependence in which the intensity is the highest above the top surface and becomes lower temporarily obliquely above the top surface, and then becomes higher again at the lateral side. If the LED devices 12 are mounted onto the mounting substrate 11 as in FIG. 1, as the light traveling in the longitudinal direction in FIG. 1, the light emitted from the side surface of the LED devices 12 contributes, and as the light traveling upward and in the transverse direction in FIG. 1, the light emitted from the top surface of the LED devices 12 contributes mainly. In such a manner, the emitted light spreads into the surroundings of the mounting substrate 11.

Since the LED devices 12 are arranged at the leading end part of the mounting substrate 11, the number of members blocking light of the LED devices 12 is reduced when the LED module 10 is incorporated in an LED lamp, etc., and therefore, wide light distribution is maintained. At the LED devices 12 mounted onto the side surface of the mounting substrate 11, light emitted from the side surface of one of the LED devices 12 is blocked by the side surface of another neighboring LED device 12, and therefore, the amount of light that can be substantially emitted from the side surfaces is reduced. However, there are only two parts where the LED devices 12 neighbor in the LED module 10, i.e., the number of parts where light is blocked is small (see FIG. 2), and therefore, the loss due to this is small.

Next, a manufacturing method of the LED module 10 is explained.

First, two large-sized copper plates and a sheet-shaped insulating material are prepared. Next, the insulating material is sandwiched by the large-sized copper plates, and the insulating material and the copper plates are bonded while heating and applying a pressure. Next, by cutting the large-sized copper plates, the column-shaped mounting substrate 11 is obtained. Next, the LED devices 12 are joined to the mounting substrate 11 by reflow, and thereby the LED module 10 is obtained.

Figure 4:
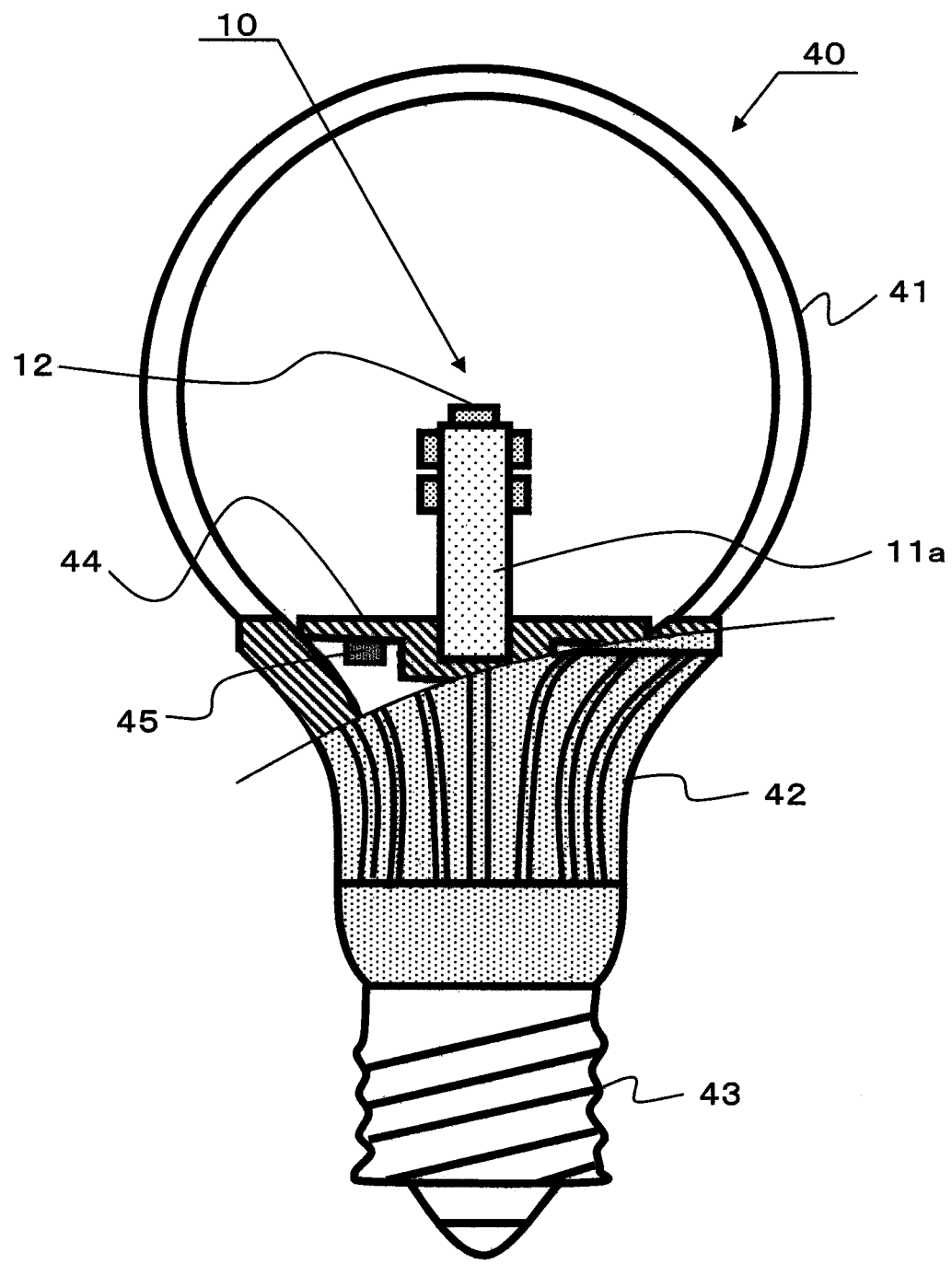
FIG. 4 is a front view illustrating an LED lamp 40 using the LED module 10 in a partially longitudinal section.

FIG. 4 is a front view illustrating an LED lamp 40 using the LED module 10 in a partially longitudinal section.

The LED lamp 40 includes a globe 41, a case 42, a base 43, etc. On the top part of the case 42 (on the side of the globe 41), the globe 41 and a base material 44 are fixed to the case 42. Onto the base material 44, electronic parts 45, such as a resistor, are mounted, and into the base material 44, the LED module 10 is inserted. The LED devices 12, which are the light emitting part of the LED module 10, are located in the vicinity of the center of the globe 41. The LED module 10 is inserted into a fixing part of the base material 44 and pressed by a spring (not shown). To the spring, a function for supplying electricity to the copper plate 11a and the copper plate 11c is added. It may also be possible to fix the LED module 10 to the base material 44 by solder, etc., in place of the spring and to supply electricity via the solder, etc.

Figure 5:
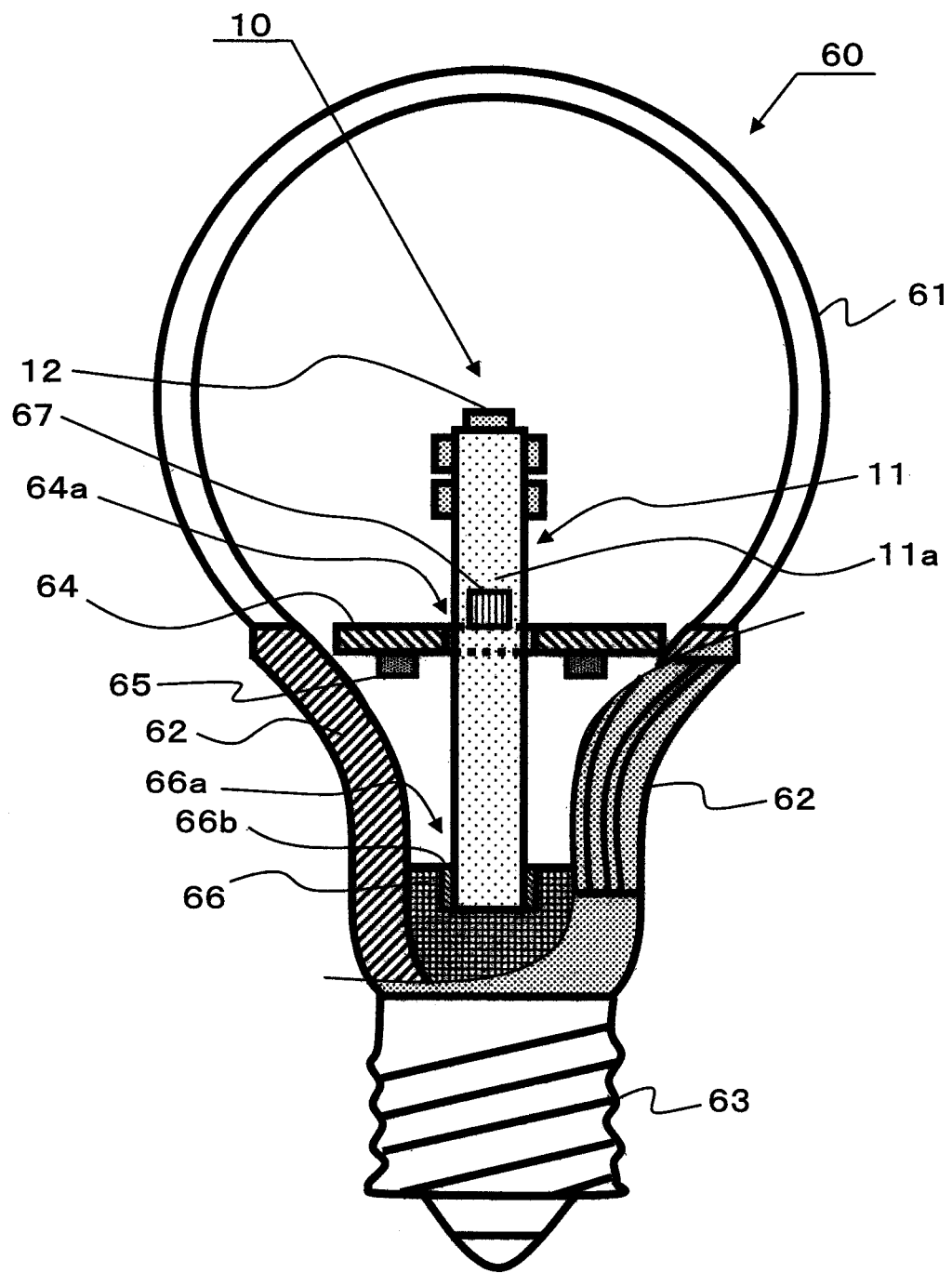
FIG. 5 is a front view illustrating another LED lamp 60 using the LED module 10 in a partially longitudinal section.

FIG. 5 is a front view illustrating another LED lamp 60 using the LED module 10 in a partially longitudinal section.

The LED lamp 60 includes a globe 61, a case 62, a base 63, etc. On the top part of the case 62 (on the side of the globe 61), the globe 61 and a circuit substrate 64 are fixed to the case 62. The circuit substrate 64 has a through hole 64a and the mounting substrate 11 of the LED module 10 penetrates the through hole 64a. In FIG. 5, only the copper plate 11a is illustrated as the mounting substrate 11 of the LED module 10.

At the lower part of the case 62, a thermally conductive part 66 is coupled to the case 62, and the case 62 and the thermally conductive part 66 constitute a heat sink. The thermally conductive part 66 has an insertion hole 66a, and into the insertion hole 66a, the mounting substrate 11 of the LED module 10 is inserted. In the insertion hole 66a, the gap between the mounting substrate 11 and the thermally conductive part 66 is filled with silicone 66b which has high thermal conductivity. As the thermally conductive part 66, a metal or resin having high thermal conductivity is used. In the LED lamp 60, the thermally conductive part 66 and the case 62 are separate parts, however, it may also be possible to integrally form the thermally conductive part 66 and the case into one unit.

The five LED devices 12 mounted onto the LED module 10 as a light source are arranged in the vicinity of the center of the globe 61. At the middle part of the LED module 10, an electrode, not shown, of the circuit substrate 64 and the copper plate 11a are connected by solder 67, and a current is supplied from the electrode to the copper plate 11a. Similarly, the copper plate 11c (see FIG. 1), not shown, on the backside is also connected to another electrode by solder, and a current flows out from the copper plate 11c to the electrode. In other words, at the middle part of the LED module 10, electricity is supplied from the circuit substrate 64 to the LED module 10 via the solder 67 and the solder, not shown, on the backside. On the circuit substrate 64, electronic parts 65, such as a resistor and a capacitor, are mounted and a wire (not shown) to the base 63 is also connected.

In the LED lamp 60, the circuit substrate 64 is arranged in the horizontal direction (direction orthogonal to the LED module 10), and therefore, the through hole 64a is provided. However, depending on the LED lamp, the circuit substrate may be arranged in the vertical direction (direction parallel to the LED module 10). At this time, in order to supply electricity to the LED module 10, it may also be possible to directly solder a wire without using the circuit substrate or to use a connector.

Next, the heat dissipation process of the LED lamp 60 is explained.

Heat produced by the LED devices 12 is transferred to the thermally conductive part 66 via the mounting substrate 11 of the LED module 10. The mounting substrate 11 includes the copper plate 11a and the copper plate 11c (see FIG. 1), and therefore, the thermal conductivity is high. As a result of this, it is possible to transfer heat with a low thermal resistance from the LED devices 12 to the case 62 through the mounting substrate 11 and the thermally conductive part 66. Finally, this heat is discharged to the outside from the case 62.

Figure 6:
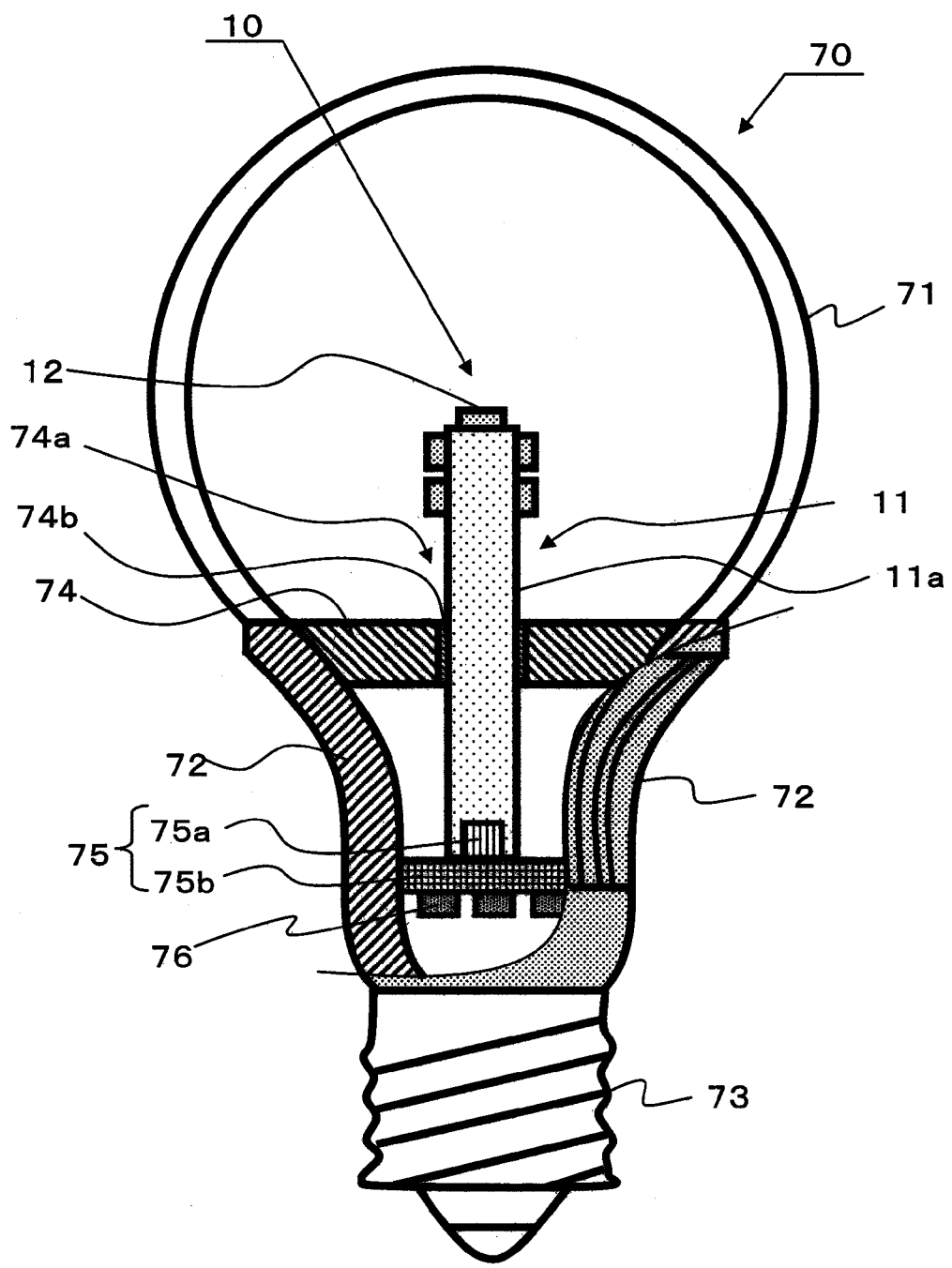
FIG. 6 is a front view illustrating another LED lamp 70 using the LED module 10 in a partially longitudinal section.

FIG. 6 is a front view illustrating another LED lamp 70 using the LED module 10 in a partially longitudinal section.

The LED lamp 70 includes a globe 71, a case 72, a base 73, etc. On the top part of the case 72 (on the side of the globe 71), the globe 71 and a thermally conductive part 74, which is part of a heat sink, are fixed to the case 72. The heat sink includes the thermally conductive part 74 and the case 72, and the thermally conductive part 74 and the case are coupled. In the center of the thermally conductive part 74, an opening 74a is provided, and the LED module 10 is inserted into the opening 74a. In FIG. 6, only the copper plate 11a is illustrated as the mounting substrate 11. In the opening 74a, the gap between the mounting substrate 11 and the thermally conductive part 74 is filled with silicone 74b which has high thermal conductivity. As the thermally conductive part 74, a metal or resin having high thermal conductivity is used. In the LED lamp 70, the thermally conductive part 74 and the case 72 are separate parts, however, it may also be possible to integrally form them into one unit.

The five LED devices 12 mounted onto the LED module 10 as a light source are arranged in the vicinity of the center of the globe 71. The rear end part of the LED module 10 is in contact with a circuit substrate 75b, and the copper plate 11a is fixed to the circuit substrate 75b by solder 75a. The solder 75a is also connected to an electrode, not shown, on the circuit substrate 75b, and from this electrode, a current is supplied to the copper plate 11a. Similarly, the copper plate 11c (see FIG. 1), not shown, on the backside is also connected to another electrode by solder, and a current flows out from the copper plate 11c to this electrode. The circuit substrate 75b, the solder 75a, and the solder, not shown, on the backside constitute an electricity supply unit 75 to the LED module 10. On the circuit substrate 75b, electronic parts 76, such as a resistor and a capacitor, are mounted and a wire (not shown) to the base 73 is also connected.

Next, the heat dissipation process of the LED lamp 70 is explained.

Heat produced by the LED devices 12 is transferred to the thermally conductive part 74 via the mounting substrate 11 of the LED module 10. The mounting substrate 11 includes the copper plate 11a and the copper plate 11c (see FIG. 1), and therefore, the thermal conductivity is high. Since the thermally conductive part 74 is located on the top part of the case 72, the distance from the LED devices 12 to the thermally conductive part 74 is short, and therefore, the thermal resistance is reduced. As a result of this, it is possible to transfer heat with a low thermal resistance from the LED devices 12 to the case 72 through the mounting substrate 11 and the thermally conductive part 74. Finally, the heat is discharged to the outside from the case 72.

In the LED module 10, the semiconductor layer 33 of each LED device 12 is connected directly to the mounting substrate 11 via the solder 21, the solder 22, the p-side protruding electrode 34a, and the n-side protruding electrode 34b. In this case, if the thermal expansion coefficient of the mounting substrate 11 and the thermal expansion coefficient of the semiconductor layer 33 are different, there is a possibility that peeling-off occurs on the periphery of the semiconductor layer 33 due to the heat cycle. Because of this, it is preferable to make the thermal expansion coefficient in the mounting direction of the mounting substrate 11 and the thermal expansion coefficient of the semiconductor layer 33 the same by adjusting the materials and thicknesses of the copper plate 11a, the copper plate 11c, and the insulation layer 11b.

In the LED module 10, the first metal plate and the second metal plate are copper plates. In order to further increase the thermal conductivity, it is preferable to form the first metal plate and the second metal plate into a heat pipe. The heat pipe is a hermetically sealed metal vessel in which a small amount of a liquid (working liquid) is sealed under vacuum and a capillary structure (wick) is provided on the inner wall. When part of the heat pipe is heated, the working liquid evaporates at the heated portion (absorption of evaporative latent heat) and the vapor moves to a low-temperature portion. When the vapor condenses at the low-temperature portion (discharge of evaporative latent heat), the condensed liquid circulates to the heated portion by the capillary phenomenon. The series of phase changes takes place continuously, and therefore, heat moves quickly.

The LED module 10 has the structure in which the insulation layer 11b is sandwiched by the two copper plate 11a and copper plate 11b. However, the material of the metal plates of the LED module is not limited to copper and for example, aluminum may be accepted. In the case of aluminum, the well-known joining solder for aluminum is used or an electrically conductive paste formed by kneading and mixing electrically conductive particles in an adhesive is used in place of solder. The LED module is required only to have a column shape and high thermal conductivity, and therefore, the structure thereof is not limited to a structure in which metal plates are bonded with an insulation layer sandwiched in between. For example, the LED module may be a column-shaped metal provided with an insulating coat, a column-shaped ceramic, such as alumina and aluminum nitride, or a column-shaped resin having high thermal conductivity (if the resin has electrical conductivity, the surface is subjected to insulation treatment) and having wiring formed on the side surface thereof by printing, etc.

The electricity supply unit 75 included in the LED lamp 70 is required only to be capable of supplying electricity to the LED module 10 under the thermally conductive part 74, and therefore, the structure thereof is not limited to a structure including the circuit substrate 75b and the solder 75a. For example, it may also be possible to provide a member for fixing the bottom part of the LED module 10 with a spring and to add the function for supplying electricity to the spring. Further, it may also be possible to separate the member for fixing the bottom part of the LED module 10 from the member for supplying electricity.

In the LED device 12 of the LED module 10, the LED die 30 is coated with the fluorescent resin 31 and the white reflective layer 35, and the p-side protruding electrode 34a and the n-side protruding electrode 34b serve as the connection electrodes with the mounting substrate 11. That is, the LED device 12 has one aspect of the so-called chip size package (also referred to as CSP). However, in many LED devices, onto a submount substrate including electrodes for connection (also referred to as an interposer), an LED die is mounted and the LED die is coated. At this time, a plurality of LED dies may be mounted on the submount substrate.

Figure 7:
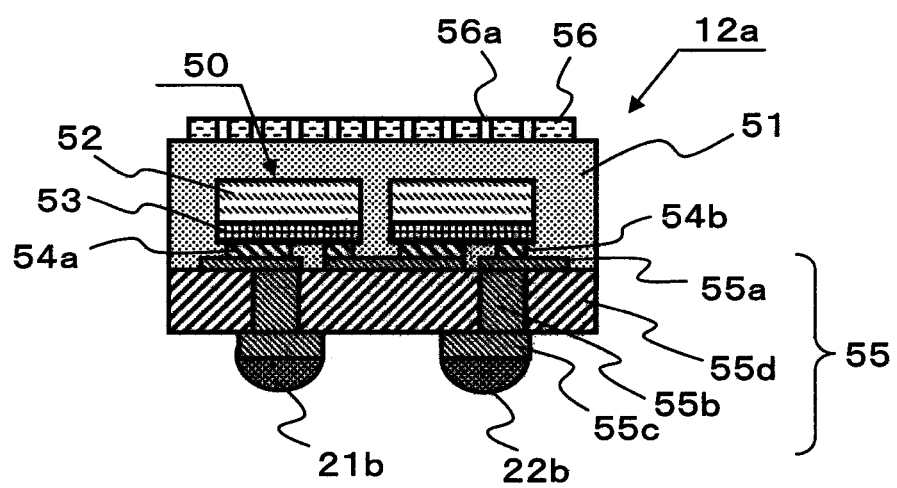

FIG. 7 is a sectional view of an LED device 12a included in an LED module similar to the LED module 10.

In some cases, it is desired to adjust the light distribution of the LED module in order to improve quality of the LED lamp. Thus, by using FIG. 7, an LED module is explained which has an LED device including a submount substrate and which is capable of improving the light distribution with a simple structure.

As illustrated in FIG. 7, the LED device 12a includes two LED dies 50. Each LED die 50 includes a sapphire substrate 52, a semiconductor layer 53, a p-side protruding electrode 54a, and an n-side protruding electrode 54b. The main difference from the LED die 30 illustrated in FIG. 1 lies in the planar size. While the planar size of the LED die 30 is 0.8 mm×0.4 mm, the planar size of the LED die 50 is 0.3 mm×0.3 mm. Other parts are the same as those in FIG. 1, and therefore, explanation is omitted here.

The LED die 50 is flip-chip-mounted onto a submount substrate 55. In the submount substrate 55, a packaging electrode 55a is formed on the top surface of a plate material 55d, and a connection electrode 55c is formed on the undersurface thereof, and the mounting electrode 55a and the connection electrode 55c are connected via a through hole 55b. To the undersurface of the connection electrode 55c, the solder 21b and the solder 22b are attached. The two LED dies 50 are connected in series on the submount substrate 55, and the connection electrode 55c on the solder 21b side serves as the anode of the LED device 12a and the connection electrode 55c on the solder 22b side serves as the cathode of the LED device 12a. That is, to the metal plate (copper plate 11a) on the plus side of the mounting substrate 11 (see FIG. 1), the connection electrode 55c on the solder 21b side is connected and to the metal plate (copper plate 11c) on the minus side, the connection electrode 55c on the solder 22b side is connected. In this manner, the forward voltage of the LED device 12a is increased and the LED device 12a is easy to handle.

The side surface and the top surface of the LED die 50 are coated with a fluorescent resin 51. The fluorescent resin 51 is the same as the fluorescent resin 31 illustrated in FIG. 3. On the top of the fluorescent resin 51, a reflective layer 56 formed of a metal reflective plate is provided, and in the reflective layer 56, a large number of minute through holes 56a are formed. The reflective layer 56 reflects part of light beams that are emitted in the upward direction, and emits the part of light beams from the side surface of the LED device 12a. The rest of the emitted light is emitted in the upward direction through the minute through holes 56a. In this manner, the reflective layer 56 increases the amount of light emitted in the lateral direction while functioning as a semi-transmissive reflective layer. By changing the planar area of the reflective layer 56 and the density of the minute through holes 56a, it is possible to adjust the amount of light emitted in the upward direction and the amount of light emitted in the lateral direction. It may also be possible to replace the reflective layer 56 with a reflective sheet in which reflective fine particles are dispersed or with a semi-transmissive reflective sheet.

In the LED device 12a, the number of serial stages of the LED dies 50 is two, however, the number of serial stages is not limited to two. For example, if an LED lamp using the LED module 10 is applied to a 12 V power source that is commonly used for a halogen lamp, since the forward voltage of each LED die is about 3 V, it is sufficient to connect four LED dies in series on the submount substrate. It may also be possible to increase the forward voltage of the LED module 10 by using a light emitting element (also referred to as a monolithic element) in which light emitting diodes are connected in series on an insulating substrate, such as a sapphire substrate.

In the LED device 12a, the LED dies 50 are flip-chip-mounted onto the submount substrate 55. The mounting method of an LED die onto a submount substrate is not limited to the flip-chip mounting, and face-up mounting using wire bonding may be accepted. The flip-chip mounting has the characteristics of high light extraction efficiency and high area efficiency since no wire is used, and has the characteristic of high thermal conductivity since the semiconductor layer is connected directly to the submount substrate.

What is claimed is:

1. An LED module comprising:
a column-shaped mounting substrate in which a first metal plate, an insulation layer, and a second metal plate are laminated in order, the mounting substrate having a long side in the surface direction of the first metal plate and the second metal plate, the length of the long side being greater than the thickness in the lamination direction; and
a plurality of LED devices connected to the first metal plate and to the second metal plate at a leading end part in the long side direction of the mounting substrate with the first metal plate as a plus-side electrode and the second metal plate as a minus-side electrode,
wherein the mounting substrate has a structure in which the insulation layer is sandwiched between the first metal plate and the second metal plate, and
each of the plurality of LED devices includes an LED die whose side surface and top surface are coated with a fluorescent resin, and is connected to the first metal plate and the second metal plate by solder so as to straddle the insulation layer.

2. The LED module according to claim 1, wherein the mounting substrate has two side surfaces to which the insulation layer is exposed, and
part or all of the plurality of LED devices are mounted onto the two side surfaces.

3. The LED module according to claim 1, wherein part of the plurality of LED devices are mounted onto an end surface of the leading end part in the long side direction of the mounting substrate.

4. The LED module according to claim 1, wherein each of the plurality of LED devices includes a plurality of LED dies, and the plurality of LED dies is connected in series.

5. The LED module according to claim 1, wherein each of the LED devices comprises any one of a reflective layer and a semi-transmissive reflective layer on the opposite surface of the surface mounted onto the mounting substrate.

6. The LED module according to claim 1, wherein the first metal plate and the second metal plate are heat pipes.

7. An LED lamp comprising:
a globe;
a case for supporting the globe;
the LED module according to claim 1 in which the plurality of LED devices is arranged so as to be located in the vicinity of the center of the globe as a light source; and
a thermally conductive part coupled to the case and with which the LED module comes into contact.

8. The LED lamp according to claim 7, wherein a rear end part of the LED module on the opposite side of the leading end part in the long side direction of the mounting substrate of the LED module comes into contact with the thermally conductive part, and electricity is supplied to the LED module at a middle part of the LED module located between the leading end part and the rear end part.

9. The LED lamp according to claim 8, wherein the thermally conductive part comprises an insertion hole, and the rear end part of the LED module is inserted into the insertion hole.

10. The LED lamp according to claim 7, further comprising a circuit substrate arranged on the globe side of the case, the circuit substrate having a through hole which the LED module penetrates, wherein electricity is supplied from the circuit substrate to the LED module.

11. The LED lamp according to claim 7, wherein a middle part of the LED module located between the leading end part and a rear end part on the opposite side of the leading end part in the long side direction of the mounting substrate of the LED module comes into contact with the thermally conductive part, and electricity is supplied to the LED module at the rear end part of the LED module.

12. The LED lamp according to claim 11, wherein the thermally conductive part comprises an opening, and the LED module penetrates the opening.

13. An LED lamp comprising:
a globe;
a case for supporting the globe;
an LED module including
a column-shaped mounting substrate in which a first metal plate, an insulation layer, and a second metal plate are laminated in order, the mounting substrate having a long side in the surface direction of the first metal plate and the second metal plate, the length of the long side being greater than the thickness in the lamination direction, and
a plurality of LED devices connected to the first metal plate and to the second metal plate at a leading end part in the long side direction of the mounting substrate with the first metal plate as a plus-side electrode and the second metal plate as a minus-side electrode, wherein the plurality of LED devices is arranged so as to be located in the vicinity of the center of the globe as a light source;
a thermally conductive part coupled to the case and with which the LED module comes into contact; and
a circuit substrate arranged on the globe side of the case, the circuit substrate having a through hole which the LED module penetrates, wherein electricity is supplied from the circuit substrate to the LED module.

* * * * *